United States Patent [19]

Mito

[11] Patent Number: 4,561,915
[45] Date of Patent: Dec. 31, 1985

[54] PROCESS FOR EPITAXIAL GROWTH ON A CORRUGATED WAFER

[75] Inventor: Ikuo Mito, Tokyo, Japan

[73] Assignee: NEC Corporation, Tokyo, Japan

[21] Appl. No.: 625,052

[22] Filed: Jun. 26, 1984

[30] Foreign Application Priority Data

Jun. 28, 1983 [JP] Japan ................. 58-116341

[51] Int. Cl.⁴ .......................... H01L 21/368
[52] U.S. Cl. ................... 148/171; 29/576 E; 29/569 L; 148/172; 148/173; 148/175; 156/624
[58] Field of Search ............... 148/171, 172, 173, 175; 29/576 E, 569 L; 156/624

[56] References Cited

U.S. PATENT DOCUMENTS

| 4,023,993 | 5/1977 | Seifres et al. | 148/172 |
| 4,073,676 | 2/1978 | Aiki et al. | 156/624 |
| 4,227,962 | 10/1980 | Antypas | 156/624 |
| 4,468,258 | 8/1984 | Pfister et al. | 148/1.71 X |

OTHER PUBLICATIONS

Sakai et al., *IEEE J. of Quantum Electronics*, vol. QE-18, No. 8, Aug. 1982, pp. 1272-1277.
Kinoshita et al., *Electronics Letters*, vol. 19, No. 6, Mar. 1983, pp. 215 and 216.
Antypas, *Appl. Phys. Lett.*, vol. 37 (1), Jul. 1, 1980, pp. 64 and 65.
Nagai et al., *Jpn. J. of Applied Physics*, vol. 22, No. 5, May 1983, pp. L291-L293.

*Primary Examiner*—George T. Ozaki
*Attorney, Agent, or Firm*—Sughrue, Mion, Zinn, Macpeak & Seas

[57] ABSTRACT

A process for epitaxial growth which effects epitaxial growth while suppressing thermal deformation of surface corrugations of an InGaAsP/InP system semiconductor substrate. Deformation of surface corrugations is suppressed by disposing a $GaAs_{1-z}P_z$ ($0.1 \leq z \leq 0.8$) wafer over and in close contact with the surface of the semiconductor substrate until immediately before a start of the epitaxial growth process.

12 Claims, 6 Drawing Figures

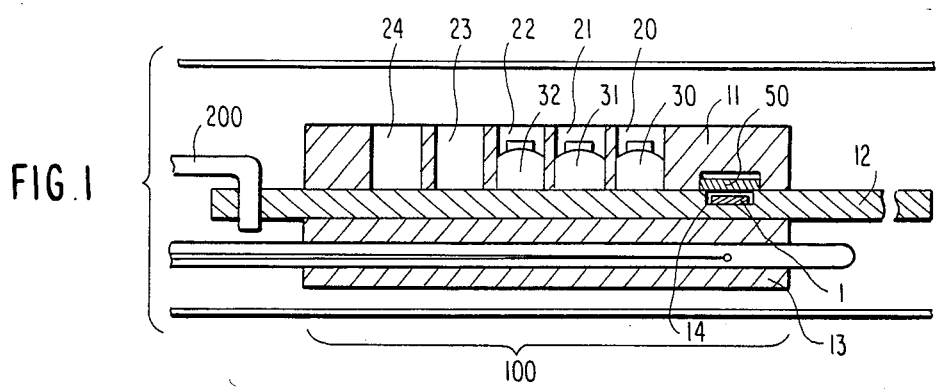
FIG.1
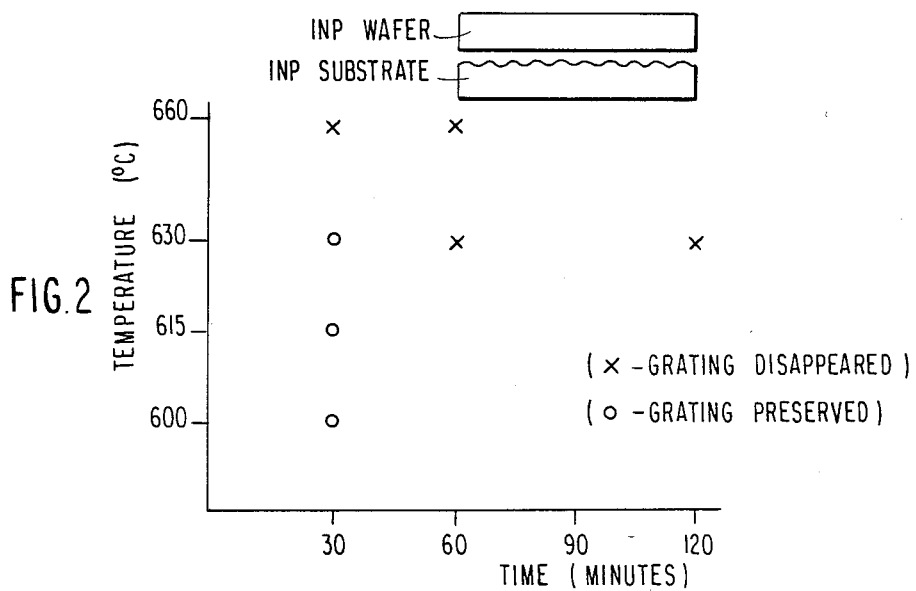
FIG.2
FIG.3
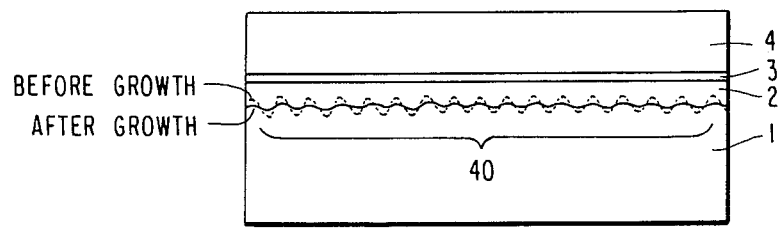

PROCESS FOR EPITAXIAL GROWTH ON A CORRUGATED WAFER

BACKGROUND OF THE INVENTION

The present invention relates to a method of effecting epitaxial growth which suppresses deformation of a surface of a substrate which has corrugations formed thereon.

In parallel with improvements recently attained in transmission systems in optical fiber communications, there is an increasing demand for semiconductor lasers which lase in a single longitudinal mode. Extensively studied today, in an attempt to meet such a demand, are distributed feedback laser diodes (DFB LD) and distributed Bragg reflector laser diodes (DBR LD).

For fabricating semiconductor lasers with the above-mentioned feature, it is necessary to effect epitaxial growth on a grating substrate which has corrugations formed on its surface at a period of several thousands of Angstroms. What is important for epitaxial growth is preventing the corrugations on the grating substrate from being deformed. It is generally observed, however, that the corrugations are thermally deformed while held at a high temperature before epitaxial growth or deformed by the meltback of the surface in liquid phase epitaxial (LPE) growth.

Especially, in the case of an InGaAsP system employing InP as a substrate which is capable of forming a semiconductor laser in a wavelength range of 1.1–1.6 microns, an important range for optical fiber communications, dissociation of P from the surface of the InP semiconductor layer or from the surface of the InGaAsP layer is considerable and, therefore, how to protect the grating before epitaxial growth is the critical problem.

One approach heretofore proposed to solve the above problem involves closely covering a grating substrate with an InP crystal (K. Sakai et al., "1.5 $\mu$m Range InGaAsP/InP Distributed Feedback Lasers", IEEE JOURNAL OF QUANTUM ELECTRONICS, August 1982, VOL. QE-18, No. 8, pp. 1272-1277) or with a GaAs crystal (J. Kinoshita et al., "Preserving InP Surface Corrugations for 1.3 $\mu$m GaInAsP/InP DFB Lasers from Thermal Deformation during LPE Process", ELECTRONICS LETTERS, Mar. 17, 1983, Vol. 19, No. 6, pp. 215-216). Another known approach involves protecting a grating substrate in an atmosphere of P which evaporates from a Sn—P solution, utilizing the fact that a large amount of InP dissolves in a Sn solution (G. A. Antypas, "Prevention of InP Surface Decomposition in Liquid Phase Epitaxial Growth", Appl. Phys. Lett. 37(1), July 1, 1980, pp. 64-65). Still another known approach is introducing PH$_3$ in a reactor tube to elevate the P pressure (Nagai et al., "Deformation and Preservation of Diffraction Grating for Long Wavelength Band DFB Lasers", Lecture No. 6a-S-1, Manuscripts of 30th Joint Meeting of Applied Physics, Spring 1983, pp. 635 (in Japanese) or Nagai et al, "Prevention of Surface Corrugation Thermal Deformation for InGaAsP/InP DFB Lasers", Japanese Journal of Applied Physics, Vol. 22, No. 5, May, 1983, pp. L291-L293). However, each of the described approaches has both merits and demerits and more convenient and effective implementations have been demanded.

SUMMARY OF THE INVENTION

It is therefore an object of the present invention to provide a process for epitaxial growth which effects epitaxial growth while suppressing deformation of corrugations on the surface of an InGaAsP/InP system semiconductor substrate.

In accordance with the present invention, there is provided a process for epitaxial growth characterized in that, when an $In_{1-x'}Ga_{x'}As_{y'}P_{1-y'}$ laser ($x'>0, y'>0$) is to be formed by epitaxial growth on a semiconductor substrate which as a corrugation formed in an InP crystal or an $In_{1-x}Ga_xAs_yP_{1-y}$ ($x>0, y>0$) layer formed on the InP crystal on a surface thereof, a $GaAs_{1-z}P_z$ ($0.1 \leq z \leq 0.8$) wafer is disposed over and in close contact with the surface of the semiconductor substrate until immediately before a start of the epitaxial growth.

BRIEF DESCRIPTION OF THE DRAWING

FIG. 1 is a schematic sectional view of a reactor tube generally used for epitaxial growth;

FIG. 2 is a plot representative of a thermal deformation characteristic which develops when a grating substrate is held at a high temperature and use is made of a protective InP wafer;

FIG. 3 is a section of a multi-layer semiconductor substrate formed by epitaxial growth using a protective InP wafer;

DETAILED DESCRIPTION OF THE PREFERRED EMBODIMENTS

Figure 4:
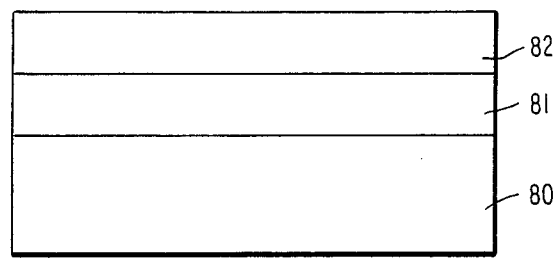
FIG. 4 is a section of a protective $GaAs_{0.6}P_{0.4}$ wafer applied to an example of the present invention.

Referring to FIG. 1 of the drawings, there is schematically shown a reactor tube system inclusive of a transverse carbon slide boat 100 which is installed in equipment for liquid phase epitaxial (LPE) growth. The carbon slide boat 100 comprises a melt holder 11, a slider 12 and a base block 13. The slider 12 is formed with a groove 14 for loading a substrate 1 therein. The melt holder 11, on the other hand, is formed with melt reservoirs 20, 21, 22, 23 and 24 in which a desired number of melts, such as 30, 31 and 32, are held. The slide boat 100 is held at a high temperature and then cooled to a predetermined temperature. As soon as the predetermined temperature is reached, a pull rod 200 is pulled leftwardly in the drawing so that the substrate 1 is brought into contact with the melt 30 to cause epitaxy of a semiconductor layer. Subsequently, the substrate 1 is sequentially moved into contact with the melts 31 and 32 in order to form a plurality of semiconductor layers on the substrate by epitaxy.

A method of preventing thermal deformation of the surface of the substrate 1, which is most convenient and features excellent operationability and reproducibility, is disposing a protective wafer 50 over and in close contact with the substrate 1 before epitaxial growth.

Referring to FIG. 3, over the substrate 1 is an n-InGaAsP waveguide layer 2, a nondoped InGaAsP active layer 3 and a p-InP cladding layer 4 which were experimentally deposited by the equipment shown in FIG. 1 using the melts 30, 31 and 32. For the experiment, the substrate 1, was a (100) InP grating substrate (Sn-doped, n-type, carrier density of $2\times10^{18}$cm$^{-3}$) which had been formed with a generally triangular diffraction grating along the <110> direction with a period of 3,950 Å and a depth of 2,000 Å. Prior to the epitaxial growth, an experiment was conducted to determine how the InP substrate 1 is thermally deformed while the boat 100 is kept at a high temperature before epitaxial growth.

Protective InP Wafer

Thermal dissociation of P from an InP crystal substrate generally becomes intense in a high temperature range above 500°–550° C. With this in view, an InP crystal was first used as a protective wafer 50, for the experiment. It was true that, where the surface of the substrate 1 was formed flat or the corrugations were dimensioned larger than about 10 microns in height, the protective InP wafer successfully preserved the surface configuration of the substrate.

However, the situation is different when it comes to fine corrugations with a surface height in the 1,500–300 Å range.

FIG. 2 is a plot showing the results of tests which were performed with protective (001) InP wafers. The ordinate in FIG. 2 represents temperature and the abscissa, time, which were the conditions for high-temperature holding tests. The tests were conducted in an atmosphere wherein purified hydrogen was continuously caused to flow at a rate of 300 c.c. per minute. When held at 660° C., the 2000 Å grating formed first on the surface of the InP substrate 1 disappeared due to heat, leaving not a trace of periodic corrugations. Even at 630° C., almost all the grating disappeared when the hold time was extended beyond 60 minutes. At 630° C., the grating was preserved when the hold time was 30 minutes. Further, at 615° C. and 600° C., gratings on the substrates 1 were also preserved.

In the aspect of crystal growth, where a lattice-matched InGaAsP layer is to be epitaxially grown on an InP substrate, the quality of the resultant crystal generally tends to be enhanced when grown at a high temperature. Taking this into account, a multi-layer film having the structure shown in FIG. 3 was continuously grown by holding it at 630° C. for 30 minutes. The cooling rate was 0.8° C. per minute and maintained thereat throughout the growth. Growth of the first layer, n-InGaAsP waveguide layer 2, was initiated at a temperature of 615° C. The n-InGaAsP waveguide layer 2 (lasing wavelength of 1.15 microns, Sn-doped, carrier density of $1\times10^{18}$cm$^{-3}$) was grown to a thickness of 0.4 micron, the nondoped InGaAsP active layer 3 (lasing wavelength of 1.3 microns) to a thickness of 0.15 micron, and the p-InP cladding layer 4 to a thickness of 1 micron.

When observed by a scanning electron microscope, the depth of the periodic structure 40 at the interface between the InP substrate 1 and the n-InGaAsP waveguide layer 2 was measured to be 200–300 Å, a considerable decrease from the initial 2,000 Å. Such originated not from the thermal deformation before epitaxial growth but from the meltback which occurred upon the contact of the InP substrate 1 with the melt 30, which provided the waveguide layer 2. Practically the same meltback was observed even when the degree of supersaturation of the melt was sequentially raised up to the order of 15° C. The conclusion was that it is difficult to effect epitaxial growth while leaving a deep diffraction grating, by the use of a protective InP wafer.

Protective GaAs Wafer

Another experiment was conducted using a (100) GaAs protective wafer which Kinoshita et al. proposed in the previously mentioned Electronic Letters. When such a protective wafer was held at 630° C. for 30 minutes, the depth of a diffraction grating was decreased from the initial 2,000 Å to the order of 500 Å and this taught that thermal deformation of the InP substrate 1 achievable with the arsenic pressure only, which evaporates from the GaAs wafer, is not prevented to an acceptable extent. However, epitaxial growth actually performed did not change the depth of the grating, providing that no meltback occurred during the growth of the n-InGaAsP waveguide layer 2. Presumably, this is ascribed to a thin As film which was formed on the surface of the InP substrate 1.

As described above, it was difficult to sufficiently limit deformation of a defraction grating on an InP substrate either by an InP protection wafer or a GaAs protective wafer.

Protective GaAsP Wafer

An experiment was performed using a protective GaAs$_{0.6}$P$_{0.4}$ wafer, which represents an example of the process in accordance with the present invention. For the experiment, a (001) GaAs$_{0.6}$P$_{0.4}$ wafer was used in which, as shown in FIG. 4, a GaAs substrate 80 carries thereon a GaAs$_{1-z}$P$_z$(z<1) layer 81 which was deposited by vapor growth to have a sequentially increasing P concentration and, atop the strata, a GaAs$_{0.6}$P$_{0.4}$ layer 82. The layer 81 is adapted for matching the lattice constants of the layers 80 and 82. The wafer was arranged in device shown in FIG. 1 as the protective wafer 50 such that the GaAs$_{0.6}$P$_{0.4}$ layer 82 faces the diffraction grating on the InP substrate 1. Before and after 30 minutes of holding at 630° C., the depth of the grating of the InP substrate 1 showed a change of not more than 100 Å and the grating depth was measured to be substantially 2,000 Å. This is probably because P and As evaporating from the GaAs$_{0.6}$P$_{0.4}$ wafer 50 effectively prevented thermal deformation of the grating.

Using the above-stated protective wafer, an experiment was conducted to cause epitaxial growth on the substrate 1. First, the protective wafer was placed in the reactor tube to face the substrate and then the temperature was elevated to 630° C. within about 1 hour. This temperature, 630° C., was maintained for 30 minutes until the melts reach equilibrium, thereby continuously growing the multi-layer structure shown in FIG. 5. The cooling rate was 0.8° C./min. and this was maintained throughout the growth. The first layer, n-InGaAsP waveguide layer 2, was started to grow at 615° C. The n-InGaAsP waveguide layer 2 (lasing wavelength of 1.15 microns, Sn-doped, carrier density of $1\times10^{18}$cm$^{-3}$) was grown to a thickness of 0.4 micron, the nondoped InGaAsP active layer 3 (lasing wavelength of 1.3 microns) to a thickness of 0.15 micron, and the p-InP cladding layer 4 (Zn-doped, carrier density of $1\times10^{18}$cm$^{-3}$) to a thickness of 1 micron.

Even under the above condition, the thin As film deposited on the surface of the InP substrate 1 served to suppress meltback compared to the case with an InP wafer, leaving a grating in the 1,500 Å range. That is, it was proved that the use of a GaAs$_{0.6}$P$_{0.4}$ offers two different effects at once: P which evaporates prevents thermal deformation while As, which evaporates and deposits on the InP substrate 1, limits meltback.

Figure 5:
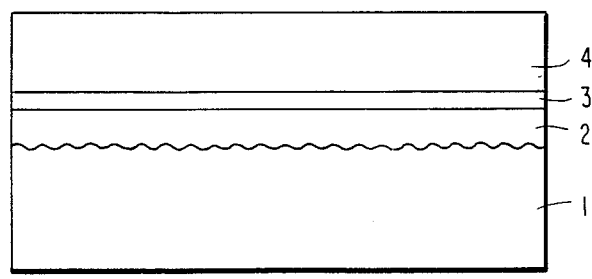
FIG. 5 is a schematic section of a multi-layer structure formed by epitaxial growth in accordance with an example of the present invention.
Figure 6:
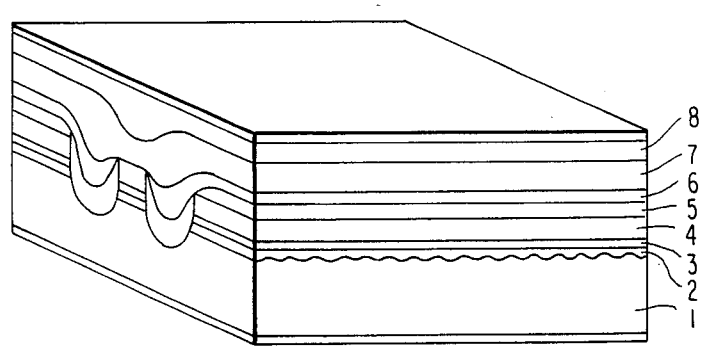
FIG. 6 is a perspective view of a buried DFB semiconductor laser fabricated by the process of the present invention.

FIG. 5 shows a multi-layer substrate which was grown by use of the $GaAs_{0.6}P_{0.4}$ protective wafer. Using the substrate, a buried DFB semiconductor laser was fabricated with a structure shown in FIG. 6 for the purpose of controlling a transverse mode operation and reducing a threshold current. This provided a device having desirable characteristics, that is, a device with a oscillation wavelength of about 1.3 microns had a threshold value of 30 mA and a differential quantum efficiency of 25% per facet and lased in a single longitudinal mode up to about three times the threshold value. A laser diode having the construction shown in FIG. 6 is disclosed in U.S. application Ser. No. 447,553 Dec. 7, 1982 for Double Channel Planar Buried Heterostructure with Periodic Structure Formed in Guide Layer in the names of Masafumi Seki and Ikuo Mito and is incorporated herein.

While z of the protective $GaAs_{1-z}P_z$ wafer employed in the above embodiment was 0.4, it was confirmed that the attainable effect remains the same even if z is reduced to the order to 0.1. $GaAs_{1-z}P_z$ wafers with z smaller than 0.1 were found ineffective due to substantial extents of thermal deformation. As for larger values of x, wafers up to the order of $GaAs_{0.2}P_{0.8}$ were confirmed to be effective.

The (001) $GaAs_{1-z}P_z$ wafer used in the example of the present invention may be effectively replaced by a $GaAs_{1-z'}P_{z'}$ wafer in the vicinity of (001), or in or adjacent to (110), (111)A or (111)B.

While, in the above embodiment, the corrugated InP substrate was used, a semiconductor substrate having an $In_{1-x}Ga_xAs_yP_{1-y}$ layer on the InP substrate may be corrugated in the layer and used for epitaxial growth.

Although the example of the present invention has been described in relation with equipment for liquid phase epitaxial growth, it is also effectively applicable to equipment for hydride vapor phase epitaxial growth, or one for vapor phase epitaxial growth of the type using organic metal.

In summary, it will be seen that the present invention, by use of a protective $GaAs_{1-z}P_z$ wafer, successfully protects the surface of an InP or InGaAsP layer which is formed with a diffraction grating or like fine corrugations, while limiting the deformation of the surface due to epitaxial growth.

What is claimed is:

1. A method of liquid phase epitaxial growth for epitaxially growing an $In_{1-x'}Ga_{x'}As_{y'}P_{1-y'}$ layer ($x'>0, y'>0$) on a semiconductor substrate which has a corrugation formed in an InP crystal or an $In_{1-x}Ga_xAs_yP_{1-y}$ ($x>0, y>0$) layer formed on the InP crystal on a surface thereof comprising a step of: placing a $GaAs_{1-z}P_z$ ($0.1 \leq z > 0.8$) wafer on the surface of the semiconductor substrate until immediately before a start of the liquid phase epitaxial growth.

2. A method for suppressing thermal deformation of surface corrugations of an InGaAsP/InP system semiconductor substrate during a liquid phase epitaxial growth process comprising the step of placing a $GaAs_{1-z}P_z$ wafer on the corrugated surface of the semiconductor substrate until immediately before the liquid phase epitaxial growth process begins.

3. The method for suppressing thermal deformation of surface corrugations of an InGaAsP/InP system semiconductor substrate during a liquid phase epitaxial growth process as claimed in claim 2, further comprising the step of forming said $GaAs_{1-z}P_z$ wafer by disposing over a layer of GaAs a first layer of $GaAs_{1-z}P_z$ having an increasing P concentration measured from the GaAs layer, and forming over said first layer of $GaAs_{1-z}P_z$ a second layer of $GaAs_{1-z}P_z$, said first layer of $GaAs_{1-z}P_z$ being adapted for matching the lattice constants of said GaAs layer and said second layer of $GaAs_{1-z}P_z$.

4. The method for suppressing thermal deformation of surface corrugations of an InGaAsP/InP system semiconductor substrte during a liquid phase epitaxial growth process as claimed in claim 3, further comprising the step of placing the said second layer of $GaAs_{1-z}P_z$ in contact with said surface corrugations of said semiconductor substrate.

5. The method for suppressing thermal deformation of surface corrugations of an InGaAsP/InP system semiconductor substrate during a liquid epitaxial growth process as claimed in claim 3, wherein z of said second $GaAs_{1-z}P_z$ layer satisfies the relationship $0.1 \leq z \leq 0.8$.

6. The method for suppressing thermal deformation of surface corrugations of an InGaAsP/InP system semiconductor substrate during a liquid phase epitaxial growth process as claimed in claim 2, further including the steps of forming the surface corrugations in the InP substrate layer, and placing said $GaAs_{1-z}P_z$ wafer on the corrugated surface of said InP substrate until immediately before the liquid phase epitaxial growth process begins.

7. The method for suppressing thermal deformation of surface corrugations of an InGaAsP/InP system semiconductor substrate during a liquid phase epitaxial growth process as claimed in claim 2, further including the steps of disposing an $In_{1-x}Ga_xAs_yP_{1-y}$ layer on the InP substrate, providing surface corrugations in said $In_{1-x}Ga_xAs_yP_{1-y}$ layer, and placing $GaAs_{1-z}P_z$ wafer on the corrugated surface of said $In_{1-x}Ga_xAs_yP_{1-y}$ layer until immediately before the liquid phase epitaxial growth begins.

8. The method for suppressing thermal deformation of surface corrugations of an InGaAsP/InP system semiconductor substrate during a liquid phase epitaxial growth process as claimed in claim 2, wherein said $GaAs_{1-z}P_z$ wafer is a (001) $GaAs_{1-z}P_z$ wafer.

9. The method for suppressing thermal deformation of surface corrugations of an InGaAsP/InP system semiconductor substrate during liquid phae epitaxial growth process as claimed in claim 2, wherein said $GaAs_{1-z}P_z$ wafer is replaced by a $GaAs_{1-z'}P_{z'}$ wafer in the vicinity of (001).

10. The method for suppressing thermal deformation of surface corrugations of an InGaAsP/InP system semiconductor substrate during a liquid phase epitaxial growth process as claimed in claim 2, wherein said $GaAs_{1-z}P_z$ wafer is replaced by a $GaAs_{1-z'}P_{z'}$ wafer in the vicinity of (110).

11. The method for suppressing thermal deformation of surface corrugations of an InGaAsP/InP system semiconductor substrate during a liquid phase epitaxial growth process as claimed in claim 2, wherein said $GaAs_{1-z}P_z$ wafer is replaced by a $GaAs_{1-z'}P_{z'}$ wafer in the vicinity of (111)A.

12. The method for suppressing thermal deformation of surface corrugations of an InGaAsP/InP system semiconductor substrate during a liquid phase epitaxial growth process as claimed in claim 2, wherein said $GaAs_{1-z}P_z$ wafer is replaced by a $GaAs_{1-z'}P_{z'}$ wafer in the vicinity of (111)B.

* * * * *

UNITED STATES PATENT AND TRADEMARK OFFICE
CERTIFICATE OF CORRECTION

PATENT NO. : 4,561,915
DATED : December 31, 1985
INVENTOR(S) : Ikuo MITO

It is certified that error appears in the above-identified patent and that said Letters Patent is hereby corrected as shown below:

Column 5, Line 54, (Claim 1), "$0.1 \leq z > 0.8$)"

Should read --($0.1 \leq z \leq 0.8$)--

Column 6, Line 10, "substrte" should read --substrate--;

Signed and Sealed this

First Day of July 1986

[SEAL]

Attest:

DONALD J. QUIGG

Attesting Officer     Commissioner of Patents and Trademarks